US010103305B2

(12) United States Patent
Yoon et al.

(10) Patent No.: US 10,103,305 B2
(45) Date of Patent: Oct. 16, 2018

(54) HIGH EFFICIENCY LIGHT EMITTING DEVICE

(71) Applicant: Seoul Viosys Co., Ltd., Ansan-si (KR)

(72) Inventors: Yeo Jin Yoon, Ansan-si (KR); Chung Hoon Lee, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 15/523,037

(22) PCT Filed: Oct. 16, 2015

(86) PCT No.: PCT/KR2015/010977
§ 371 (c)(1),
(2) Date: Apr. 28, 2017

(87) PCT Pub. No.: WO2016/068533
PCT Pub. Date: May 6, 2016

(65) Prior Publication Data
US 2017/0338390 A1  Nov. 23, 2017

(30) Foreign Application Priority Data

Oct. 31, 2014  (KR) .................. 10-2014-0149855

(51) Int. Cl.
*H01L 33/62* (2010.01)
*H01L 33/36* (2010.01)
(Continued)

(52) U.S. Cl.
CPC ............. *H01L 33/62* (2013.01); *H01L 33/32* (2013.01); *H01L 33/36* (2013.01); *H01L 33/38* (2013.01)

(58) Field of Classification Search
CPC .................. H01L 33/62; H01L 33/36
See application file for complete search history.

(56) References Cited

U.S. PATENT DOCUMENTS

2003/0234447 A1* 12/2003 Yunus .............. H01L 23/49816
257/739
2004/0252739 A1* 12/2004 Takeuchi .............. B82Y 20/00
372/46.01
(Continued)

FOREIGN PATENT DOCUMENTS

CN       101350381      1/2009
CN       101621101      1/2010
(Continued)

OTHER PUBLICATIONS

International Search Report dated Jan. 26, 2016, in PCT/KR2015/010977.

*Primary Examiner* — Asok K Sarkar
*Assistant Examiner* — Dmitriy Yemelyanv
(74) *Attorney, Agent, or Firm* — H.C. Park & Associates, PLC

(57) ABSTRACT

A high-efficiency light-emitting device of the present invention includes: a nitride-based semiconductor laminate layer comprising a first conductive-type semiconductor layer, an active layer, and a second conductive-type semiconductor layer; a substrate comprising a first electrode and a second electrode each connected to the first conductive-type semiconductor layer and the second conductive-type semiconductor layer, a first pad electrode and a second pad electrode each connected with the first electrode and the second electrode, and a first connection pad and a second connection pad each connected with the first pad electrode and the second pad electrode; and a solder positioned between the pad electrodes and the connection pads.

13 Claims, 12 Drawing Sheets

(51) Int. Cl.
*H01L 33/32* (2010.01)
*H01L 33/38* (2010.01)

(56) References Cited

U.S. PATENT DOCUMENTS

| | | | |
|---|---|---|---|
| 2009/0321778 A1 | 12/2009 | Chen et al. | |
| 2011/0186899 A1 | 8/2011 | Van Lieshout | |
| 2011/0294242 A1* | 12/2011 | Lu | H01L 33/20 |
| | | | 438/27 |
| 2016/0071824 A1* | 3/2016 | Yoon | H01L 25/50 |
| | | | 257/738 |

FOREIGN PATENT DOCUMENTS

| | | |
|---|---|---|
| JP | 2014-116439 | 6/2014 |
| KR | 10-1007135 | 1/2011 |
| KR | 10-2012-0090493 | 8/2012 |

\* cited by examiner

HIGH EFFICIENCY LIGHT EMITTING DEVICE

CROSS-REFERENCE TO RELATED APPLICATIONS

This application in a National Stage Entry of International Application No. PCT/KR2015/010977, filed on Oct. 16, 2015, and claims priority from and the benefit of Korean Patent Application No. 10-2014-0149855, filed on Oct. 31, 2014, which is hereby incorporated by reference for all purposes as if fully set forth herein.

BACKGROUND

Field

Exemplary embodiments of the present disclosure relate to a high efficiency light emitting device, and more particularly, to a light emitting device in which a pad electrode of a light emitting diode is bonded to a connection pad on a substrate using solder.

Discussion of the Background

A light emitting diode (LED) chip is a solid state device configured to convert electrical energy into light, and generally includes semiconductor layers respectively doped with opposite conductivity types of dopants and an active layer of at least one semiconductor material interposed therebetween. Upon application of bias through the doped layers, electrons and holes are injected into and recombined in the active layer to emit light.

The LED chip is mounted on a printed substrate to be used in the form of a module. Generally, pad electrodes of the LED chip are mounted on a connection pad formed on the substrate via solder. The molten solder can flow along a side surface of the LED chip and contact side surfaces of the semiconductor layers. In this case, the solder can diffuse into the LED chip through the semiconductor layers, thereby causing electrical failure. Moreover, light emitted from the side surfaces of the semiconductor layers can be absorbed by the solder, thereby deteriorating luminous efficacy of the light emitting device.

Although an anti-diffusion layer may be formed on the side surface of the LED chip in order to prevent the solder from diffusing into the LED chip through the side surfaces of the semiconductor layers, there is a problem in that the process of manufacturing a light emitting device becomes complicated. Moreover, the anti-diffusion layer cannot prevent light emitted from the side surfaces of the semiconductor layers from being absorbed by the solder.

SUMMARY

Exemplary embodiments of the present disclosure provide a light emitting device that can prevent solder from diffusing into semiconductor layers, thereby improving reliability.

Exemplary embodiments of the present disclosure also provide a light emitting device that can prevent light emitted from side surfaces of semiconductor layers from being absorbed by solder.

In accordance with one aspect of the present disclosure, a light emitting device includes: a nitride-based semiconductor stack including a first conductive type semiconductor layer, a second conductive type semiconductor layer disposed on the first conductive type semiconductor layer, and an active layer interposed between the first conductive type semiconductor layer and the second conductive type semiconductor layer; a first electrode electrically connected to the first conductive type semiconductor layer and a second electrode disposed on the second conductive type semiconductor layer and electrically connected to the second conductive type semiconductor layer; a first pad electrode and a second pad electrode electrically connected to the first electrode and the second electrode, respectively; a substrate including a first connection pad and a second connection pad electrically connected to the first pad electrode and the second pad electrode, respectively; and solder interposed between the first pad electrode and the first connection pad and between the second pad electrode and the second connection pad. The first pad electrode is disposed to face the first connection pad; the second pad electrode is disposed to face the second connection pad; and at least one of the first pad electrode and the first connection pad facing each other or at least one of the second pad electrode and the second connection pad facing each other include at least one groove formed on surfaces thereof facing each other. At least part of the solder may be disposed in the groove. In this structure, since the groove is filled with a portion of the solder, it is possible to prevent the solder from flowing along a side surface of a light emitting structure including the nitride-based semiconductor stack, the first electrode, and the second electrode even when the same amount of solder as the amount of solder in the related art is used. Accordingly, the light emitting device can prevent the solder from diffusing to the light emitting structure and the solder in the groove can improve adhesion of the pad electrodes, thereby improving reliability of the light emitting device. In addition, the solder does not absorb light emitted through the side surface of the light emitting structure, thereby improving luminous efficacy of the light emitting device.

The groove may include a pad electrode groove formed on at least one of the first pad electrode and the second pad electrode, and the pad electrode groove may be disposed so as not to overlap a contact region between the first electrode and the first pad electrode or a contact region between the second electrode and the second pad electrode in a vertical direction. In this structure, a sufficiently large space is formed between the solder filling the pad electrode groove and the first electrode or second electrode, thereby preventing the solder having diffused into the pad electrode from diffusing to the light emitting structure.

The pad electrode groove may have a smaller depth than the thickness of the pad electrode having the pad electrode groove formed thereon. With this structure, the pad electrode disposed between the solder and the light emitting structure can prevent the solder from diffusing to the light emitting structure.

The light emitting device may further include an upper insulation layer disposed on the first electrode and insulating the first electrode from the second pad electrode, wherein the pad electrode groove may expose the upper insulation layer through the pad electrode on which the pad electrode groove is formed. In this structure, since the pad electrode groove is filled with some solder between the pad electrode and the connection pad, it is possible to prevent the solder from flowing along the side surface of the light emitting structure even when the same amount of solder as the amount of solder in the related art is used.

The upper insulation layer may include a flat region on an upper surface of the second conductive type semiconductor layer and a stepped region on a side surface of the second conductive type semiconductor layer, and the pad electrode groove may be disposed so as not to overlap the stepped region of the upper insulation layer in the vertical direction. In this structure, the solder can be prevented from diffusing to the light emitting structure through cracks formed on the stepped region of the upper insulation layer.

The groove may include a pad electrode groove formed on at least one of the first pad electrode and the second pad electrode, and the shortest distance from the pad electrode groove to the pad electrode having the pad electrode groove formed thereon may range from 10 µm to 40 µm. In this structure, the number of electrodes distributed on the side surface of the pad electrode can be minimized, thereby preventing the solder from contacting the light emitting structure. In addition, one side surface of the pad electrode may be adjacent to the side surface of the light emitting device. Accordingly, the solder can effectively fill the pad electrode groove instead of adjoining the side surface of the light emitting structure as in the related art.

The groove may include pad electrode grooves arranged in a polygonal shape on the first pad electrode and the second pad electrode. The groove may include pad electrode grooves arranged in a circular shape on the first pad electrode and the second pad electrode.

The groove may include pad electrode groove formed on the first pad electrode and the second pad electrode, and connection pad groove formed on the first connection pad and the second connection pad, in which the pad electrode groove does not overlap the connection pad groove. In this structure, the solder between the pad electrodes and the connection pads can be prevented from being biased towards one side, thereby preventing deterioration in luminous efficacy and reliability of the light emitting structure due to inclination of the light emitting device.

The pad electrode groove may be disposed in a concavo-convex pattern formed on the first and second pad electrodes in a horizontal direction, and the connection pad groove may be disposed in a concavo-convex pattern formed on the first and second connection pads and engaging with the concavo-convex pattern of the pad electrode grooves. With this structure, the light emitting device can prevent the solder between the pad electrode and the connection pad from being biased towards one side and the light emitting structure is not inclined towards one side, thereby preventing deterioration in luminous efficacy and reliability of the light emitting device. In addition, adhesion of the pad electrode can be improved in various directions, thereby improving reliability of the light emitting device.

The groove may include connection pad grooves arranged in a polygonal shape on the first and second connection pads. In addition, the groove may include connection pad grooves arranged in a circular shape on the first and second connection pads.

According to exemplary embodiments of the present disclosure, the light emitting device can prevent solder from diffusing to a light emitting structure by preventing the solder from flowing along a side surface of the light emitting structure, thereby improving reliability of the light emitting device. In addition, the solder does not absorb light emitted from the side surface of the light emitting structure, thereby improving luminous efficacy of the light emitting device. Further, the pad electrode has improved adhesion, thereby improving reliability of the light emitting device.

BRIEF DESCRIPTION OF THE DRAWINGS

FIG. 1A and FIG. 1B are plan views of a light emitting device according to an exemplary embodiment of the present disclosure, in which FIG. 1A is a plan view of a light emitting diode chip and FIG. 1B is a plan view of a substrate on which the light emitting diode chip will be mounted.

FIG. 3A and FIG. 3B are plan views of a light emitting device according to another exemplary embodiment of the present disclosure, in which FIG. 3A is a plan view of a light emitting diode chip and FIG. 3B is a plan view of a substrate on which the light emitting diode chip will be mounted.

DETAILED DESCRIPTION OF THE ILLUSTRATED EMBODIMENTS

Figure 1A:
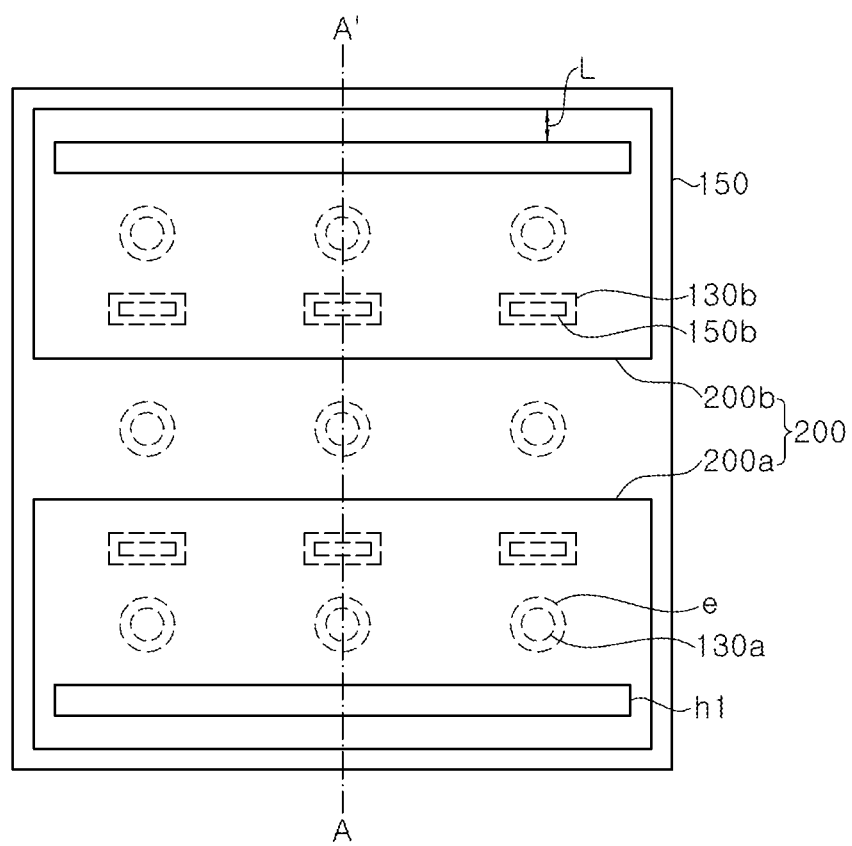

Hereinafter, exemplary embodiments of the present disclosure will be described in detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of elements can be exaggerated for clarity and descriptive purposes. When an element is referred to as being "disposed above" or "disposed on" another element, it can be directly "disposed above" or "disposed on" the other element, or intervening elements can be present. Throughout the specification, like reference numerals denote like elements having the same or similar functions.

Figure 1B:
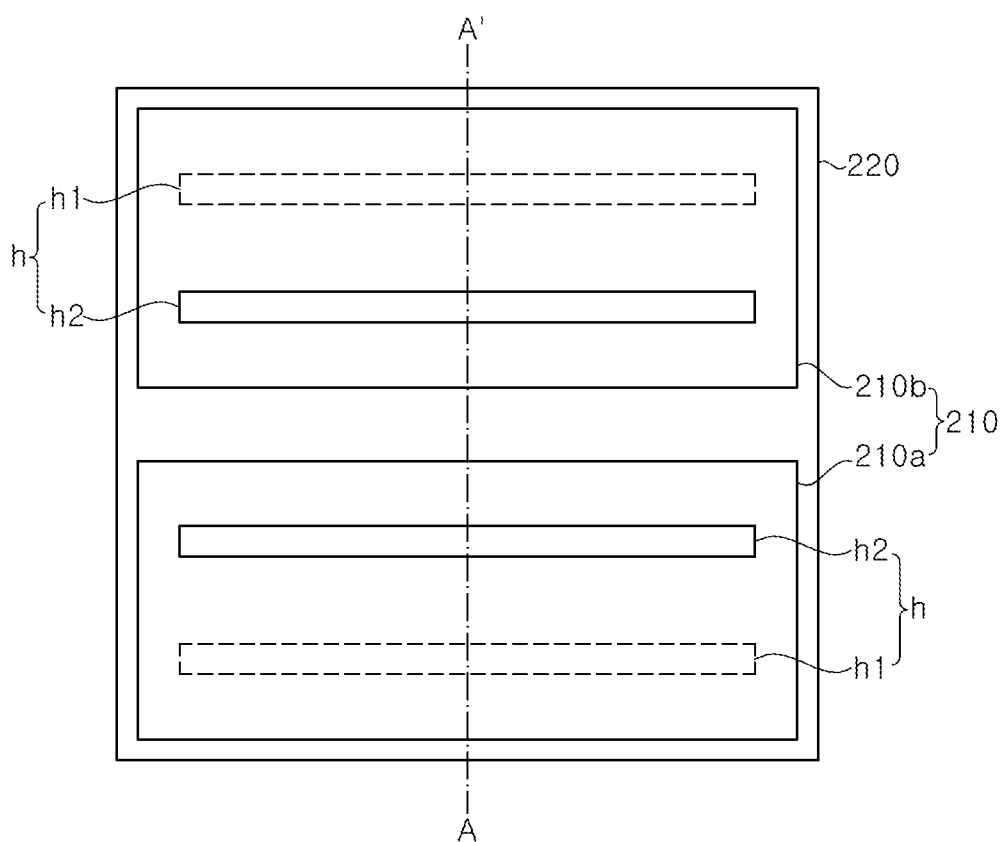
Figure 2:
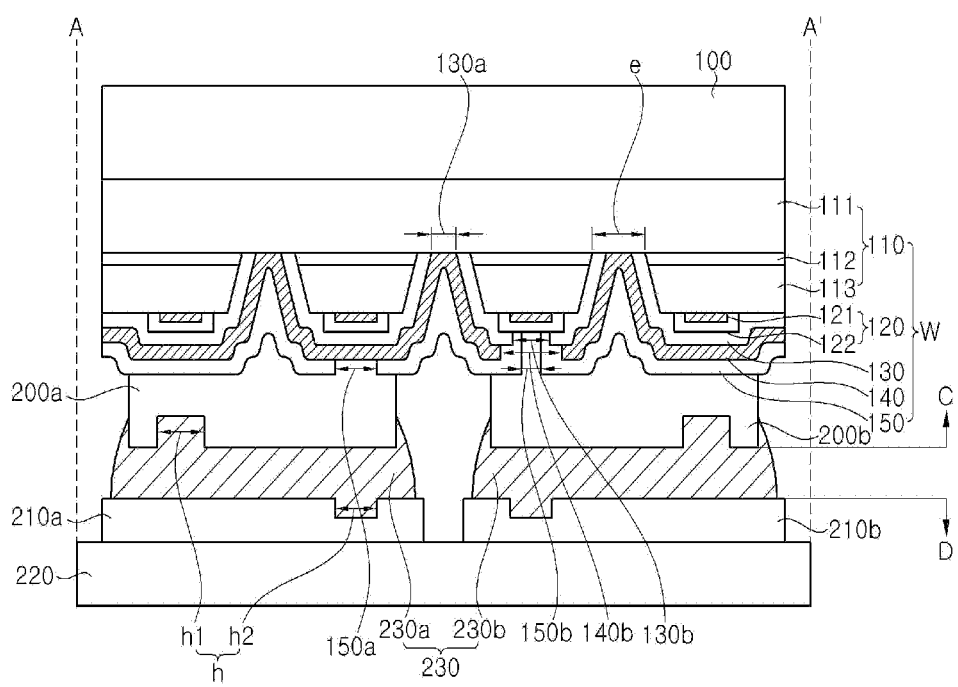
FIG. 2 is a cross-sectional view of the light emitting device according to an exemplary embodiment of the present disclosure, which is taken along line A-A' of FIG. 1A and FIG. 1B, with the light emitting diode chip of FIG. 1A mounted on the substrate of FIG. 1B via solder.

FIGS. 1A and 1B are plan views of a light emitting device according to an exemplary embodiment of the present disclosure, in which FIG. 1A is a plan view of a light emitting diode chip and FIG. 1B is a plan view of a substrate on which the light emitting diode chip will be mounted. FIG. 2 is a cross-sectional view of the light emitting device according to the exemplary embodiment of the present disclosure, which is taken along line A-A' of FIG. 1A and FIG. 1B, with the light emitting diode chip of FIG. 1A mounted on the substrate of FIG. 1B via solder. In FIG. 2, the plan view in the C direction corresponds to FIG. 1A and the plan view in the D direction corresponds to FIG. 1B.

Referring to FIG. 1 and FIG. 2, the light emitting device according to an exemplary embodiment includes a substrate, which includes a light emitting structure W, a first pad electrode 200a, a second pad electrode 200b, a base 220, and connection pads 210a, 210b, and solder 230.

The light emitting structure W may include a nitride-based semiconductor stack 110, a first electrode 140, and a second electrode 120. The nitride-based semiconductor stack 110 may include a first conductive type semiconductor layer 111, a second conductive type semiconductor layer 113 disposed on the first conductive type semiconductor layer 111, and an active layer 112 interposed between the first conductive type semiconductor layer 111 and the second conductive type semiconductor layer 113. Although FIG. 2 shows a growth substrate 100 on the first conductive type semiconductor layer 111, the growth substrate 100 may be omitted.

The first conductive type semiconductor layer 111, the active layer 112, and the second conductive type semiconductor layer 113 may include Group III-V based compound semiconductors. By way of example, the first conductive type semiconductor layer 111, the active layer 112, and the second conductive type semiconductor layer 113 may include nitride semiconductors such as (Al, Ga, In)N. The first conductive type semiconductor layer 111 may include an n-type dopant (for example, Si) and the second conductive type semiconductor layer 113 may include a p-type dopant (for example, Mg), or vice versa.

The active layer 112 may have a multi-quantum well (MQW) structure. When forward bias is applied to the nitride-based semiconductor stack 110, electrons and holes are recombined in the active layer 112 to produce light. The first conductive type semiconductor layer 111, the active layer 112, and the second conductive type semiconductor layer 113 may be formed on the growth substrate 100 by metal organic chemical vapor deposition (MOCVD), molecular beam epitaxy (MBE), or the like.

Referring to FIG. 1 and FIG. 2, the nitride-based semiconductor stack 110 may have a structure as described below, without being limited thereto. The nitride-based semiconductor stack 110 may include exposure regions (e) which partially expose the first conductive type semiconductor layer 111, and the first conductive type semiconductor layer 111 may be electrically connected to the first electrode 140 through the exposure regions (e). Current spreading efficiency and a luminous pattern of the light emitting device can be adjusted depending upon the number, location and shape of the exposure regions (e). The exposure regions (e) may be formed by photography and etching. For example, the exposure regions (e) may be formed by defining etching regions using a photoresist, followed by etching the second conductive type semiconductor layer 113 and the active layer 112 through dry etching such as ICP.

FIG. 1A and FIG. 2 show one example of the exposure regions (e) formed in a hole shape through the active layer 112 and the second conductive type semiconductor layer 113, without being limited thereto. The first conductive type semiconductor layer 111 is electrically connected to the first electrode 140 through the hole. As shown in the drawings, the hole may be regularly formed, without being limited thereto. Current spreading efficiency and a luminous pattern of the light emitting device can be adjusted depending upon the number, location and shape of the hole.

The second electrode 120 may be disposed on the second conductive type semiconductor layer 113 and may be electrically connected to the second conductive type semiconductor layer 113. The second electrode 120 includes a reflective metal layer 121 and may further include a barrier metal layer 122, which may cover an upper surface and a side surface of the reflective metal layer 121. For example, the barrier metal layer 122 may be formed to cover the upper surface and the side surface of the reflective metal layer 121 by forming a pattern of the reflective metal layer 121, followed by forming the barrier metal layer 122 thereon. For example, the reflective metal layer 121 may be formed by deposition and patterning of Ag, Ag alloy, Ni/Ag, NiZn/Ag, or TiO/Ag. On the other hand, the barrier metal layer 122 may be formed of Ni, Cr, Ti, Pt or a combination thereof and prevents diffusion or contamination of the metallic material of reflective metal layer 121. In addition, the second electrode 120 may include indium tin oxide (ITO). ITO has high light transmittance and can improve luminous efficacy of the light emitting device by suppressing absorption of light by the second electrode 120.

The first electrode 140 may be electrically connected to the first conductive type semiconductor layer 111. The first electrode 140 may cover the nitride-based semiconductor stack 110. In addition, the first electrode 140 may have an opening 140b that exposes the second electrode 120. The first electrode 140 may be formed over substantially the entire region of the growth substrate 100 excluding the opening 140b. Accordingly, electric current can be easily spread over substantially the entire region of the growth substrate 100 through the first electrode 140. The first electrode 140 may include a highly reflective layer, such as an Al layer, which may be formed on a bonding layer such as a Ti, Cr or Ni layer. In addition, a protective layer having a single layer or multilayer structure of Ni, Cr, Au, and the like may be formed on the highly reflective layer. The first electrode 140 may have a multilayer structure of, for example, Ti/Al/Ti/Ni/Au. The first electrode 140 may be formed by depositing a metallic material on the nitride-based semiconductor stack 110, followed by patterning the same.

The light emitting device according to this exemplary embodiment may further include a lower insulation layer 130. The lower insulation layer 130 covers an upper surface of the nitride-based semiconductor stack 110 and upper and side surfaces of the second electrode 120, and is disposed between the nitride-based semiconductor stack 110 and the first electrode 140 to insulate the first electrode 140 from the second electrode 120. The lower insulation layer 130 has openings 130a, 130b, which are formed in certain regions thereof and allow electrical connection between the first conductive type semiconductor layer 111 and the second conductive type semiconductor layer 113 therethrough. For example, the lower insulation layer 130 may have an opening 130a which exposes the first conductive type semiconductor layer 111, and an opening 130b which exposes the second electrode 120. The opening 130b of the lower insulation layer 130 has a smaller area than the opening 140b of the first electrode 140. The lower insulation layer 130 may be formed of an oxide layer such as $SiO_2$, a nitride layer such as $SiN_x$, or an insulation layer such as $MgF_2$, by chemical vapor deposition (CVD) or the like. The lower insulation layer 130 may be composed of a single layer or multiple layers. Alternatively, the lower insulation layer 130 may include a distributed Bragg reflector (DBR) in which a low refractivity material layer and a high refractivity material layer are alternately stacked one above another. For example, an insulating reflective layer having high reflectance may be formed by stacking $SiO_2/TiO_2$ layers or $SiO_2/Nb_2O_5$ layers.

The light emitting device according to this exemplary embodiment may further include an upper insulation layer 150. The upper insulation layer 150 may cover a portion of the first electrode 140. The upper insulation layer 150 may have an opening 150a which exposes the first electrode 140, and an opening 150b which exposes the second electrode 120. The opening 150b of the upper insulation layer 150 may have a smaller area than the opening 140b of the first electrode 140 and the opening 130b of the lower insulation layer 130. Accordingly, not only a sidewall of the opening 140b of the first electrode 140 but also a sidewall of the opening 130b of the lower insulation layer 130 may be covered by the upper insulation layer 150. With this structure, the second electrode 120 can be more effectively protected from moisture and the like. Specifically, even in the structure in which the second electrode 120 does not include the barrier metal layer, it is possible to prevent external moisture from entering the reflective metal layer of the second electrode 120. However, it should be understood that other implementations are also possible. The opening 150b of the upper insulation layer 150 may have a larger area than the opening 130b of the lower insulation layer 130. The upper insulation layer 150 may be formed by depositing and patterning an oxide insulation layer, a nitride insulation layer, or a polymer such as polyimide, Teflon™ or Parylene on the first electrode 140.

The light emitting device according to this exemplary embodiment may include the first pad electrode 200a and the second pad electrode 200b electrically connected to the first electrode 140 and the second electrode 120, respectively. Referring to FIG. 2, the first pad electrode 200a may be connected to the first electrode 140 through the opening 150a of the upper insulation layer 150 and the second pad electrode 200b may be connected to the second electrode 120 through the opening 150b of the upper insulation layer 150. The first pad electrode 200a and second pad electrode 200b serve to effectively connect the first electrode 140 and the second electrode 120 to the substrate. The first pad electrode 200a and the second pad electrode 200b may be simultaneously formed by the same process, for example, photolithography and etching, or a lift-off technology. The first pad electrode 200a and the second pad electrode 200b may include a bonding layer of, for example, Ti, Cr, or Ni, and a highly conductive metal layer of, for example, Al, Cu, Ag or Au.

The substrate may include a first connection pad 210a electrically connected to the first pad electrode 200a and a second connection pad 210b electrically connected to the second pad electrode 200b. The first connection pad 210a and the second connection pad 210b may be disposed on the base 220 of the substrate, without being limited thereto. The connection pads 210a, 210b may include a material having high electrical conductivity, for example, Cu, Au, Ag, Pt, Al, and the like. The base 220 of the substrate may include a ceramic material and may include a metallic material in order to enhance heat dissipation of the light emitting device.

The solder 230 may electrically connect the first pad electrode 200a to the first connection pad 210a and may electrically connect the second pad electrode 200b to the second connection pad 210b. The solder 230 may include a material such as Ag, Cu, Au, and Al. The pad electrodes 200a, 200b may be electrically connected to the connection pads 210a, 210b by printing or ejecting the solder 230 on the connection pads 210a, 210b, placing the pad electrodes 200a, 200b thereon, followed by heating the solder 230 to a melting point thereof. At least part of the solder 230 may be disposed in a groove h described below. As shown in FIG. 2, the groove h may be completely filled therewith, without being limited thereto. In other exemplary embodiments, the groove h may be partially filled with the solder 230. This is because voids can be partially formed inside the solder 230 depending upon properties of a material which contacts the solder 230.

The first pad electrode 200a is disposed to face the first connection pad 210a and the second pad electrode 200b is disposed to face the second connection pad 210b. On the other hand, as shown in FIG. 2, grooves h1 and h2 may be formed on the pad electrodes 200a, 200b and the connection pads 210a, 210b, respectively, without being limited thereto. At least one of the first pad electrode 200a and the first connection pad 210b facing each other or at least one of the second pad electrode 200a and the second connection pad 210b facing each other may include at least one groove h formed on surfaces thereof facing each other. At least part of the solder 230 may be disposed inside the groove h. As a result, even when the same amount of solder as the amount of solder in the related art is used, the solder can be prevented from flowing along the side surface of the light emitting structure W and prevented from contacting the side surface thereof. Accordingly, the solder 230 can be prevented from diffusing to the light emitting structure W and adhesion of the pad electrodes 200a, 200b can be improved by the solder in the groove h, thereby improving reliability of the light emitting device. Further, the solder 230 does not absorb light emitted through the side surface of the light emitting structure W, thereby improving luminous efficacy of the light emitting device. The groove h may be formed by a lift-off or etching technology using a mask.

The groove h may include a pad electrode groove h1 formed on each of the pad electrodes 200a, 200b. The pad electrode groove h1 may be disposed so as not to overlap a contact region between the first electrode 140 and the first pad electrode 200a or a contact region between the second electrode 120 and the second pad electrode 200b in the vertical direction. In this structure, a gap between the solder 230 filling the pad electrode groove h1 and the first electrode or the second electrode is sufficiently large, thereby preventing the solder 230 having diffused to the pad electrodes 200a, 200b from diffusing to the light emitting structure W.

Referring to FIG. 2, the depth of the pad electrode groove h1 may be less than the thickness of the pad electrodes 200a, 200b, on which the pad electrode groove h1 are formed. For example, the pad electrodes 200a, 200b may have a thickness of about 5 µm and the pad electrode grooves h1 may have a depth of 5 µm or less. Such pad electrode groove h1 may be formed by depositing the pad electrodes 200a, 200b to a thickness corresponding to the height of a bottom surface of the pad electrode groove h1, followed by lift-off through a mask, without being limited thereto. If the thickness of the pad electrode groove h1 is smaller than the thickness of the pad electrodes 200a, 200b, the pad electrodes 200a, 200b disposed between the solder 230 and the light emitting structure W can prevent the solder 230 from diffusing to the light emitting structure W.

Referring to FIG. 1A, the shortest distance L from the pad electrode groove h1 to one side of each of the pad electrodes 200a, 200b on which the pad electrode grooves h1 are formed may be 10 µm to 40 µm. In this structure, the solder 230 placed near the one side of each of the pad electrodes 200a, 200b fills the pad electrode groove h1. Accordingly, the amount of solder distributed on the side surface of each of the pad electrodes 200a, 200b can be minimized, thereby preventing the solder 230 from contacting the light emitting structure W. The shortest distance L may mean the shortest distance between the pad electrode groove h1 and one side of each of the pad electrodes 200a, 200b, which is adjacent to one side of the light emitting device. In this structure, the solder 230 can effectively fill the pad electrode groove h1 and thus can be prevented from adjoining the side surface of the light emitting structure W.

Referring to FIG. 1B and FIG. 2, the groove h may include a connection pad groove h2 formed on each of the first connection pad 210a and the second connection pad 210b and the pad electrode groove h1 may not overlap the connection pad groove h2. In this structure, the solder 230 between the pad electrode 200a or 200b and the connection pad 210a or 210b is prevented from being biased to one side, thereby preventing deterioration in luminous efficacy and reliability of the light emitting device due to inclination of the light emitting structure W. As shown in the drawings, the distance between the pad electrode groove h1 and one side of each of the pad electrodes 200a, 200b adjacent to one side of the light emitting structure W may be less than the distance between the connection pad groove h2 and one side of each of the connection pads 210a, 210b adjacent to the one side of the light emitting structure W, without being limited thereto. In other exemplary embodiments, the pad electrode groove h1 and the connection pad groove h2 may be formed in a different way opposite to the above structure.

Figure 3A:
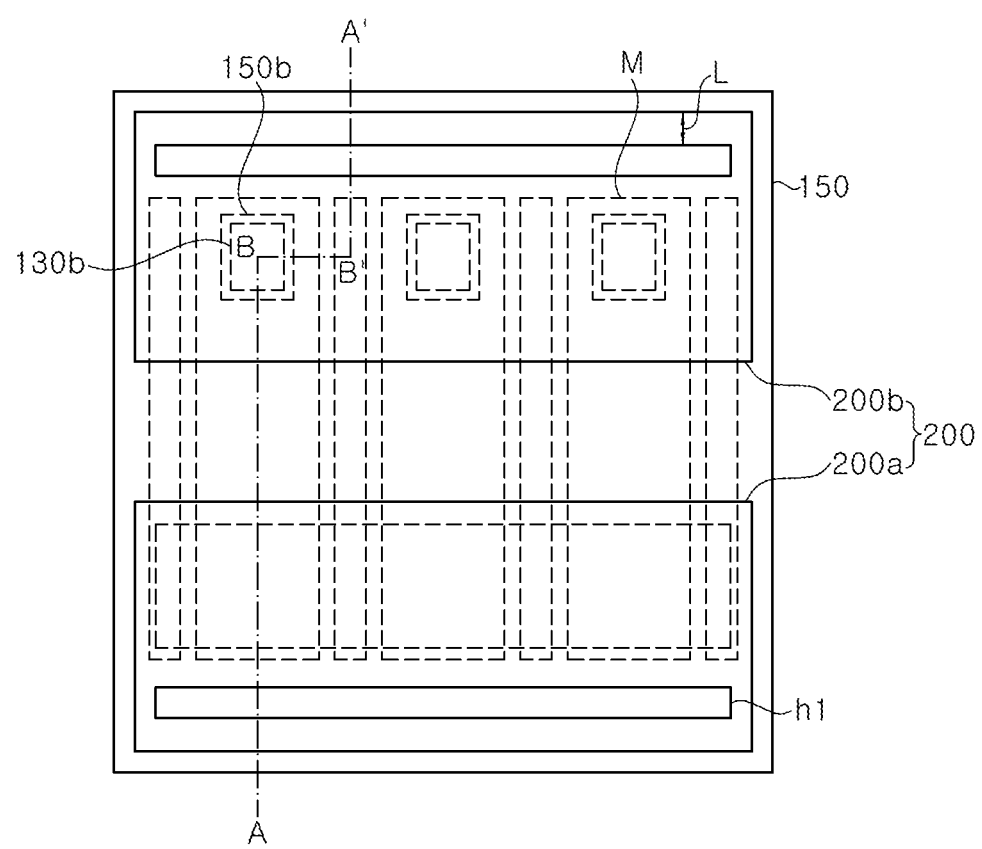
Figure 3B:
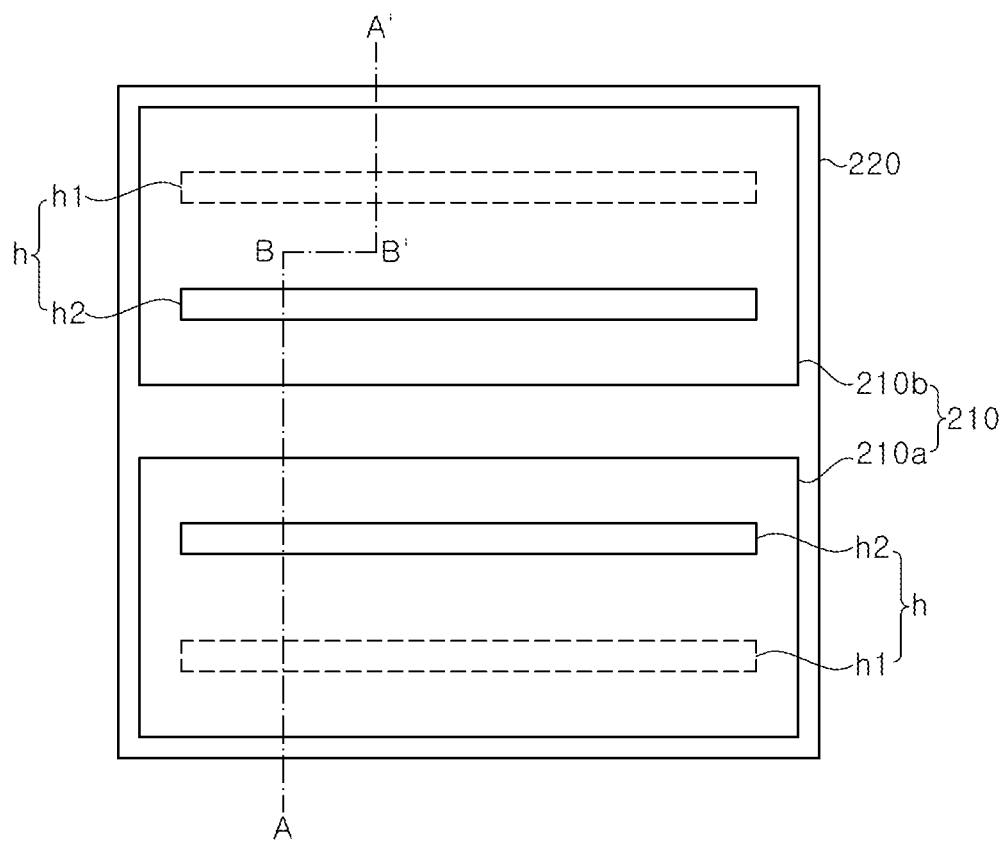
Figure 4:
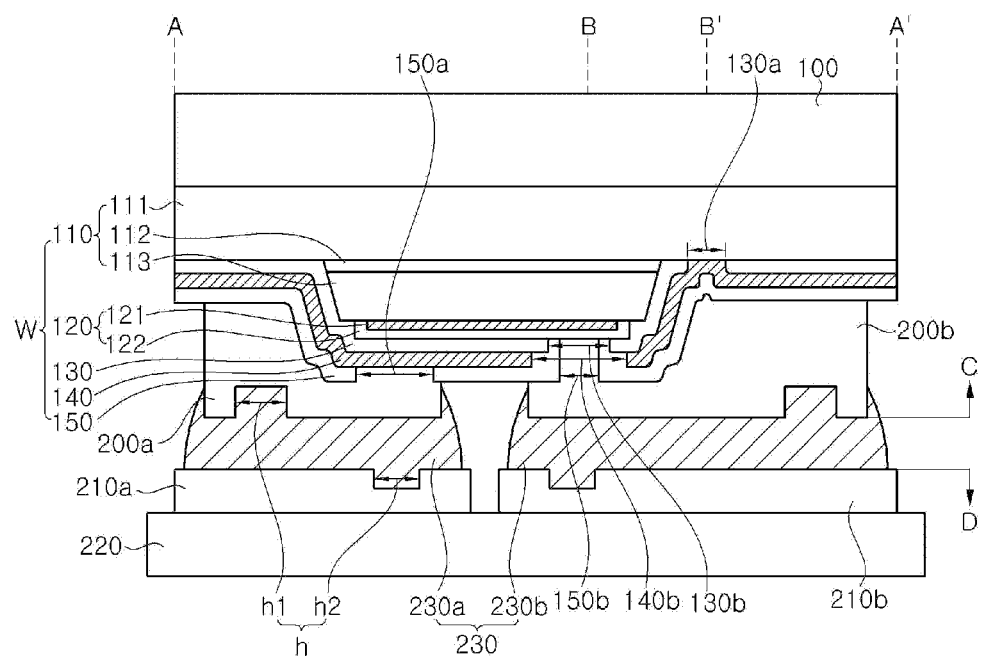
FIG. 4 is a cross-sectional view of the light emitting device according to another exemplary embodiment of the present disclosure, which is taken along line A-B-B'-A' of FIG. 3A and FIG. 3B, with the light emitting diode chip of FIG. 3A mounted on the substrate of FIG. 3B via solder.

FIGS. 3A and 3B are plan views of a light emitting device according to another exemplary embodiment of the present disclosure, in which FIG. 3A is a plan view of a light emitting diode chip and FIG. 3B is a plan view of a substrate on which the light emitting diode chip will be mounted. FIG. 4 is a cross-sectional view of the light emitting device according to another exemplary embodiment of the present disclosure, which is taken along line A-B-B'-A' of FIG. 3A and FIG. 3B, with the light emitting diode chip of FIG. 3A mounted on the substrate of FIG. 3B via solder. In FIG. 4, the plan view in the C direction corresponds to FIG. 3A and the plan view in the D direction corresponds to FIG. 3B.

The light emitting device of FIG. 3 and FIG. 4 is similar to the light emitting device described with reference to FIG. 1 and FIG. 2 except that the light emitting structure W includes a mesa M and the exposure regions (e) do not have a hole shape in the light emitting device according to this exemplary embodiment. According to this exemplary embodiment, the light emitting structure W includes at least one mesa M, which includes the active layer 112 and the second conductive type semiconductor layer 113, and the exposure regions (e) each disposed adjacent to a side surface of the mesa M and exposing the first conductive type semiconductor layer 111 such that the first conductive type semiconductor layer 111 can be electrically connected to the first electrode 140 through the exposure regions (e). The side surface of the mesa M may be formed in an inclined shape by photoresist reflow or the like, and the inclined side surface of the mesa M can improve efficiency in extraction of light generated in the active layer 112. Current spreading efficiency and a luminous pattern of the light emitting device can be adjusted depending upon the number, location and shape of the mesa M and the exposure regions (e).

Figure 5:
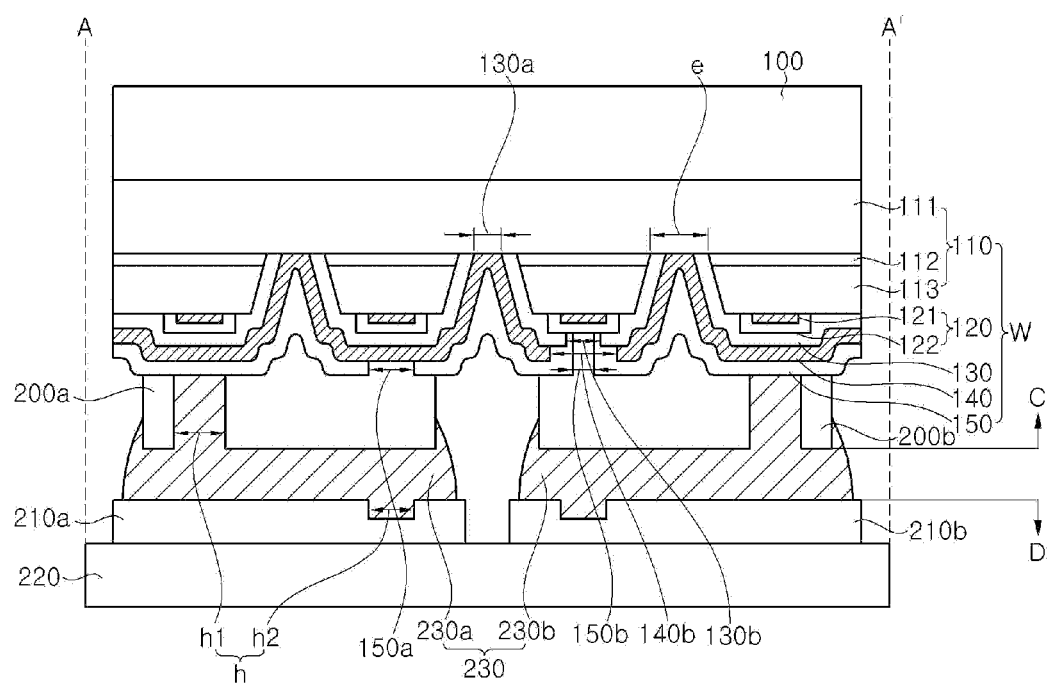
FIG. 5 is a plan view of a light emitting device according to a further exemplary embodiment of the present disclosure.

FIG. 5 is a plan view of a light emitting device according to a further exemplary embodiment of the present disclosure. The light emitting device according to this exemplary embodiment is similar to the light emitting device shown in FIG. 2 except that the pad electrode groove h1 are formed to expose the upper insulation layer 150 through the pad electrodes 200a, 200b in the light emitting device according to this exemplary embodiment. With this structure, the light emitting device according to this exemplary embodiment allows a larger amount of solder 230 to fill the groove h than the light emitting device described with reference to FIG. 1 and FIG. 2. Accordingly, the light emitting device according to this exemplary embodiment can more effectively prevent the solder 230 from contacting the side surface of the light emitting structure W.

Referring to FIG. 5, in the light emitting device according to this exemplary embodiment, the upper insulation layer 150 may include a flat region on an upper surface of the second conductive type semiconductor layer 113 and a stepped region on a side surface of the second conductive type semiconductor layer 113, and the pad electrode groove h1 may be disposed so as not to overlap the stepped region of the upper insulation layer 150 in the vertical direction. In order to form the exposure regions (e), steps are formed on the active layer 112 and the second conductive type semiconductor layer 113, and the second electrode 120 is formed in some region of the second conductive type semiconductor layer 113 to form a step between the second conductive type semiconductor layer 113 and the second electrode 120. Accordingly, the upper insulation layer 150 is formed on the first electrode 140 and steps are formed in a region including the side surface of the active layer 112, the side surface of the second conductive type semiconductor layer 113, and the side surface of the second electrode 120. Since the stepped region of the upper insulation layer 150 is formed on the side surface of the first electrode 140, the stepped region of the upper insulation layer 150 has an uneven thickness, as compared with other regions of the upper insulation layer 150 on which a step is not formed, and is likely to suffer from cracking. Thus, with the structure wherein the pad electrode grooves h1 do not overlap the stepped region of the upper insulation layer 150 in the vertical direction, the solder 230 can be prevented from diffusing to the light emitting structure W through cracks formed on the stepped region of the upper insulation layer 150.

FIG. 6A, FIG. 6B, FIG. 7A, 7B, and FIG. 8 show a light emitting structure W and pad electrodes 200a, 200b of each of light emitting devices according to other exemplary embodiments of the present disclosure. In FIG. 6A, FIG. 6B, FIG. 7A, FIG. 7B, and FIG. 8, pad electrode grooves h1 having various shapes are arranged on the pad electrodes 200a, 200b, and connection pad groove h2 of the connection pads 210a, 210b on the pad electrodes 200a, 200b are indicated by dotted lines. It should be understood that the pad electrode groove h1 and the connection pad groove h2 are not limited to the shapes shown in FIG. 6A, FIG. 6B, FIG. 7A, FIG. 7B, and FIG. 8. In addition, the pad electrode groove h1 and the connection pad groove h2 do not necessarily have the same shape.

Figure 6A:
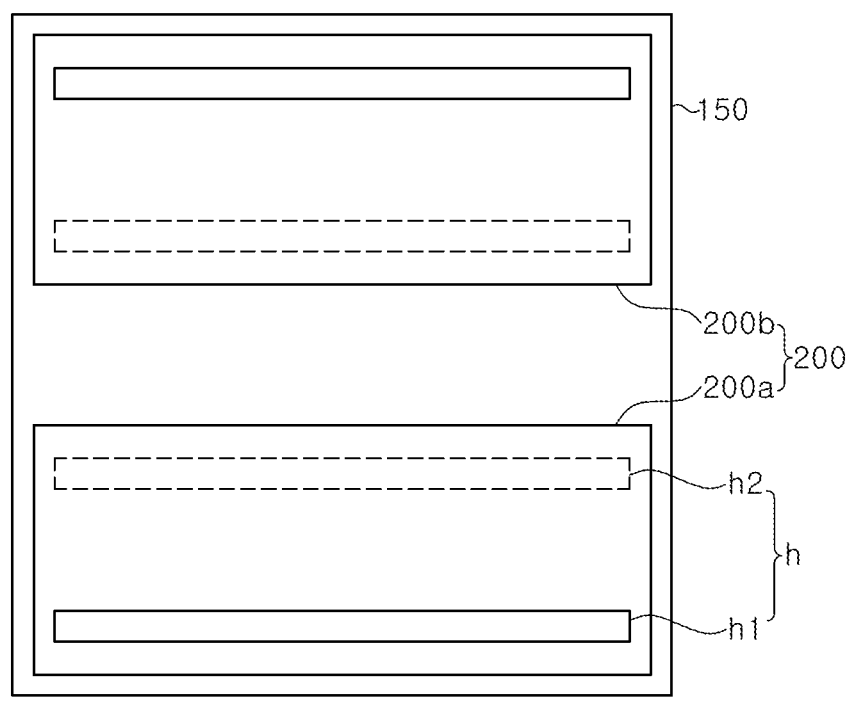
FIG. 6A, FIG. 6B, FIG. 7A, FIG. 7B, and FIG. 8 are plan views of light emitting devices according to other exemplary embodiments of the present disclosure.

Referring to FIG. 6A, the light emitting structure W and the pad electrodes 200a, 200b of the light emitting device according to this exemplary embodiment are the same as those of the light emitting device described with reference to FIG. 1, and the groove h of the light emitting device according to this exemplary embodiment may include a pad electrode groove h1 disposed in a rectangular shape on each of the first pad electrode 200a and the second pad electrode 200b. The groove h may include a connection pad groove h2 disposed in a rectangular shape on each of the first connection pad 210a and the second connection pad 210b, without being limited thereto.

Figure 6B:
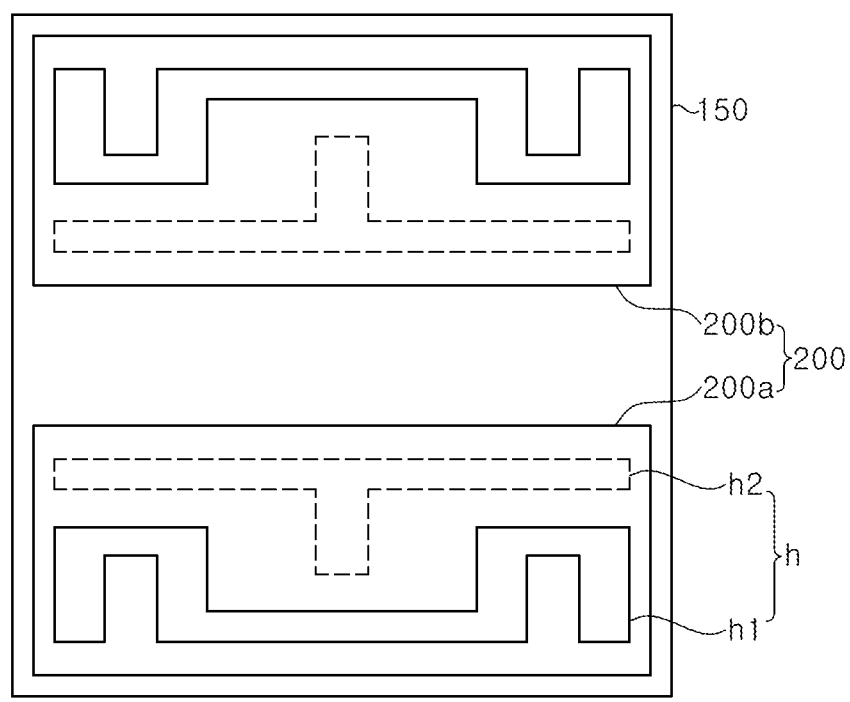

Referring to FIG. 6B, according to yet another exemplary embodiment, the groove h may include a pad electrode groove h1 disposed in a polygonal shape on each of the first pad electrode 200a and the second pad electrode 200b. The groove h may include a connection pad groove h2 disposed in a polygonal shape on each of the first connection pad 210a and the second connection pad 210b, without being limited thereto. The amount of the solder 230 filling the groove h may be adjusted depending upon the shape of the polygon.

Figure 7A:
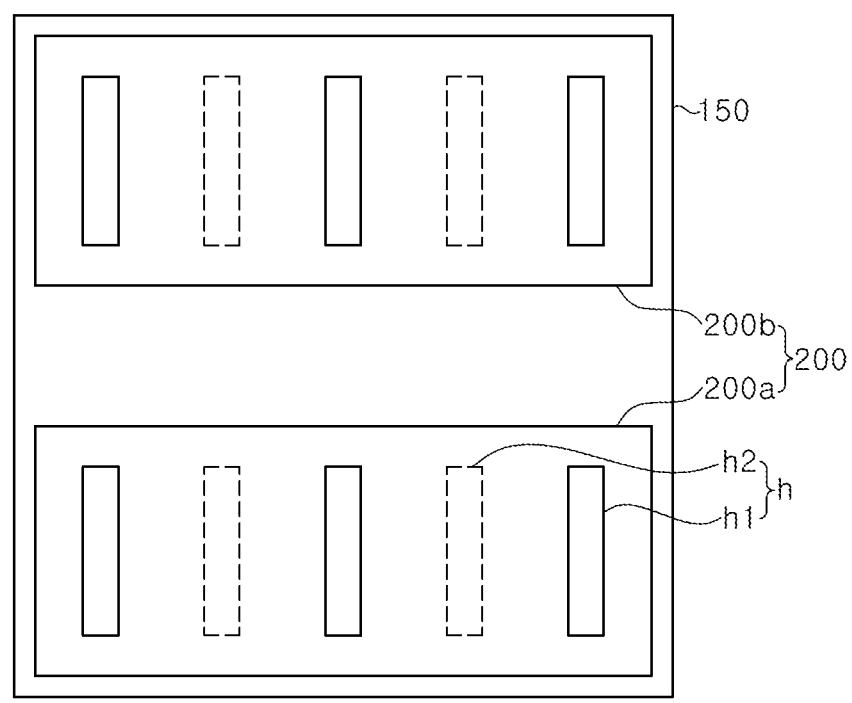

Referring to FIG. 7A, according to yet another exemplary embodiment, the groove h may be disposed in plural on each of the pad electrodes 200a, 200b and the connection pads 210a, 210b. The amount of the solder 230 filling the grooves h may be adjusted depending upon the number of grooves h.

Figure 7B:
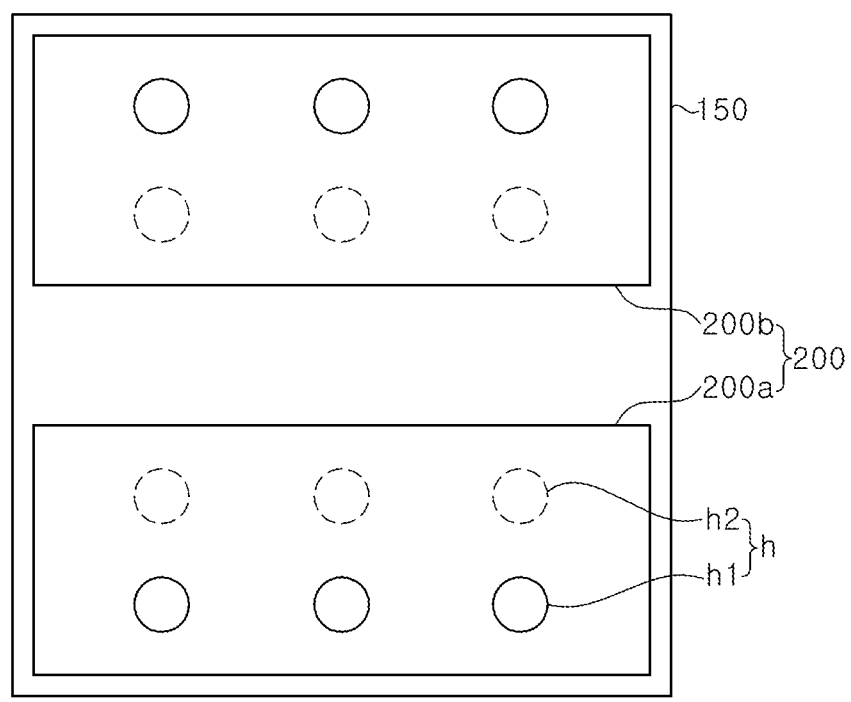

Referring to FIG. 7B, according to yet another exemplary embodiment, the groove h may include a pad electrode groove h1 disposed in a circular shape on each of the first pad electrode 200a and the second pad electrode 200b. The groove h may include a connection pad groove h2 disposed in a circular shape on each of the first connection pad 210a and the second connection pad 210b, without being limited thereto. The amount of the solder 230 filling the groove h may be adjusted depending upon the size of the circular grooves and arrangement thereof.

Figure 8:
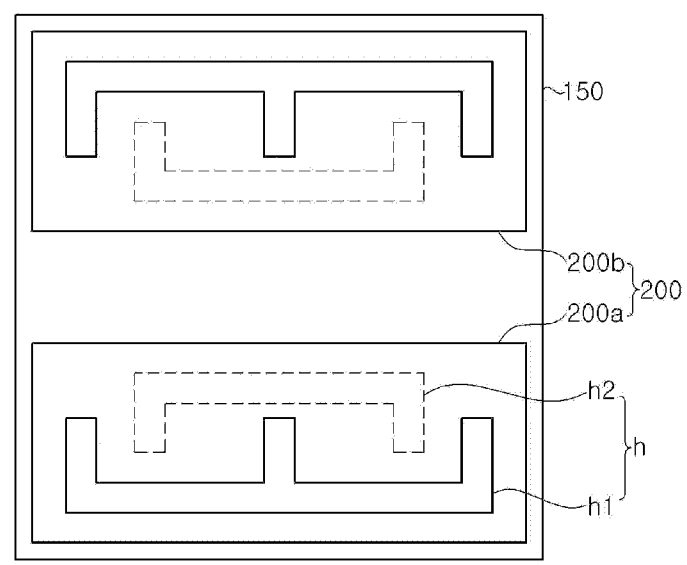

Referring to FIG. 8, according to yet another exemplary embodiment, the pad electrode groove h1 may be disposed in a concavo-convex pattern formed on each of the first pad electrode 200a and the second pad electrode 200b in the horizontal direction, and the connection pad groove h2 may be disposed in a concavo-convex pattern formed on the first connection pad 210a and the second connection pad 210b and engaging with the concavo-convex pattern of the pad electrode groove h1. For example, bumps of the connection pad groove h2 may be disposed on indentations of the pad electrode groove h1, or vice versa. In this structure, the solder 230 between the pad electrode 200a or 200b and the connection pad 210a or 210b is prevented from being biased to one side, thereby preventing deterioration in luminous efficacy and reliability of the light emitting device due to inclination of the light emitting structure W. Furthermore, adhesion of the pad electrodes 200a, 200b can be improved in various directions, thereby improving reliability of the light emitting device.

The invention claimed is:

1. A light emitting device comprising:
   a nitride-based semiconductor stack comprising a first conductive type semiconductor layer, a second conductive type semiconductor layer disposed on the first conductive type semiconductor layer, and an active layer interposed between the first conductive type semiconductor layer and the second conductive type semiconductor layer;
   a first electrode electrically connected to the first conductive type semiconductor layer and a second electrode disposed on the second conductive type semiconductor layer and electrically connected to the second conductive type semiconductor layer;
   a first pad electrode and a second pad electrode electrically connected to the first electrode and the second electrode, respectively;
   a substrate comprising a first connection pad and a second connection pad electrically connected to the first pad electrode and the second pad electrode, respectively; and
   a solder interposed between the first pad electrode and the first connection pad and between the second pad electrode and the second connection pad,
   wherein the first pad electrode is disposed to face the first connection pad and the second pad electrode is disposed to face the second connection pad,
   wherein the first pad electrode comprises a pad electrode groove,
   wherein the first connection pad comprises a connection pad groove, and
   wherein at least part of the solder is disposed in the pad electrode groove and the connection pad groove,
   wherein the second pad comprises a pad electrode groove, and
   wherein the pad electrode groove of the second pad electrode is disposed so as to not overlap a first contact region defined as an area where the second electrode contacts the second pad electrode in a vertical direction.

2. The light emitting device of claim 1, wherein the pad electrode groove of the first pad electrode is disposed so as not to overlap a second contact region defined as an area where the first electrode contacts the first pad electrode in the vertical direction.

3. The light emitting device of claim 2, wherein the pad electrode groove has a smaller depth than a thickness of the pad electrode having the pad electrode groove formed thereon.

4. The light emitting device of claim 2, further comprising:
   an upper insulation layer disposed on the first electrode and insulating the first electrode from the second pad electrode,
   wherein the pad electrode groove exposes the upper insulation layer through the pad electrode on which the pad electrode groove is formed.

5. The light emitting device of claim 4, wherein the upper insulation layer comprises a flat region on an upper surface of the second conductive type semiconductor layer and a stepped region on a side surface of the second conductive type semiconductor layer, and
   wherein the pad electrode groove is disposed so as not to overlap the stepped region of the upper insulation layer in a vertical direction.

6. The light emitting device of claim 1, wherein the shortest distance from the pad electrode groove to a side of the pad electrode having the pad electrode groove formed thereon ranges from 10 μm to 40 μm.

7. The light emitting device of claim 6, wherein one side of the pad electrode is adjacent to one side of the light emitting device.

8. The light emitting device of claim 1, wherein the pad electrode groove of the first pad electrode is arranged in a polygonal shape.

9. The light emitting device of claim 1, wherein the pad electrode groove of the first pad electrode is arranged in a circular shape.

10. The light emitting device of claim 1,
    wherein the second pad electrode comprises a pad electrode groove,
    wherein the second connection pad each comprises a connection pad groove, and
    wherein the pad electrode groove of the first pad electrode is disposed so as not to overlap the connection pad groove of the first connection pad, and
    wherein the pad electrode groove of the second pad electrode is disposed so as not to overlap the connection pad groove of the second connection pad.

11. The light emitting device according to claim 10, wherein:
    the pad electrode groove of the first pad electrode is disposed in a concavo-convex pattern in a horizontal direction,
    the pad electrode groove of the second pad electrode is disposed in a concavo-convex pattern in the horizontal direction,
    the connection pad groove of the first connection pad is disposed in a concavo-convex pattern and engaging with the concavo-convex pattern of the pad electrode groove of the first connection pad, and
    the connection pad groove of the second connection pad is disposed in a concavo-convex pattern and engaging with the concavo-convex pattern of the pad electrode groove of the second connection pad.

12. The light emitting device of claim 1, wherein the connection pad groove is arranged in a polygonal shape.

13. The light emitting device of claim 1, wherein the connection pad groove is arranged in a circular shape.

* * * * *